US009899426B2

(12) United States Patent
Yang et al.

(10) Patent No.: US 9,899,426 B2
(45) Date of Patent: Feb. 20, 2018

(54) DUAL DATA STRUCTURE FOR HIGH RESOLUTION AND REFRESH RATE

(71) Applicant: Apple Inc., Cupertino, CA (US)

(72) Inventors: Byung Duk Yang, Cupertino, CA (US);
Yong Kwan Kim, Cupertino, CA (US);
Kyung Wook Kim, Cupertino, CA (US); Shih Chang Chang, Cupertino, CA (US)

(73) Assignee: APPLE INC, Cupertino, CA (US)

( * ) Notice: Subject to any disclaimer, the term of this patent is extended or adjusted under 35 U.S.C. 154(b) by 0 days.

(21) Appl. No.: 15/215,378

(22) Filed: Jul. 20, 2016

(65) Prior Publication Data

US 2017/0309645 A1 Oct. 26, 2017

Related U.S. Application Data

(60) Provisional application No. 62/327,347, filed on Apr. 25, 2016.

(51) Int. Cl.
*H01L 27/12* (2006.01)
*G09G 3/36* (2006.01)

(52) U.S. Cl.
CPC ......... *H01L 27/124* (2013.01); *G09G 3/3659* (2013.01); *G09G 2300/0426* (2013.01); *G09G 2300/0819* (2013.01); *G09G 2320/0219* (2013.01)

(58) Field of Classification Search
CPC ............... H01L 27/124; G09G 3/3659; G09G 2300/0426; G09G 2300/0819; G09G 2320/0219
See application file for complete search history.

(56) References Cited

U.S. PATENT DOCUMENTS

| 6,791,633 | B2 | 9/2004 | Matsumoto |
| RE42,670 | E * | 9/2011 | Park ............... G02F 1/13458 257/59 |
| 8,441,606 | B2 | 5/2013 | Nakagawa et al. |
| 8,450,738 | B2 | 5/2013 | Tsubata et al. |
| 8,866,715 | B2 | 10/2014 | Tsubata |
| 2002/0176030 | A1 | 11/2002 | Matsumoto |
| 2007/0222727 | A1 | 9/2007 | Baek et al. |
| 2007/0257876 | A1 | 11/2007 | Kim |
| 2012/0105735 | A1* | 5/2012 | Tsubata ............... G09G 3/3614 348/731 |

OTHER PUBLICATIONS

PCT International Search Report and Written Opinion for International Application No. PCT/US2017/028868, dated Jul. 21, 2017, 12 pages.

* cited by examiner

*Primary Examiner* — Tucker J Wright
(74) *Attorney, Agent, or Firm* — Rutan & Tucker, LLP

(57) ABSTRACT

Display backplanes and pixel element structures are described. In an embodiment, a pixel electrode is located between two stacked data lines, with a left edge of the pixel electrode being separated from a first lower data line by approximately a same distance as a right edge of the pixel electrode is separated from a second lower data line.

17 Claims, 7 Drawing Sheets

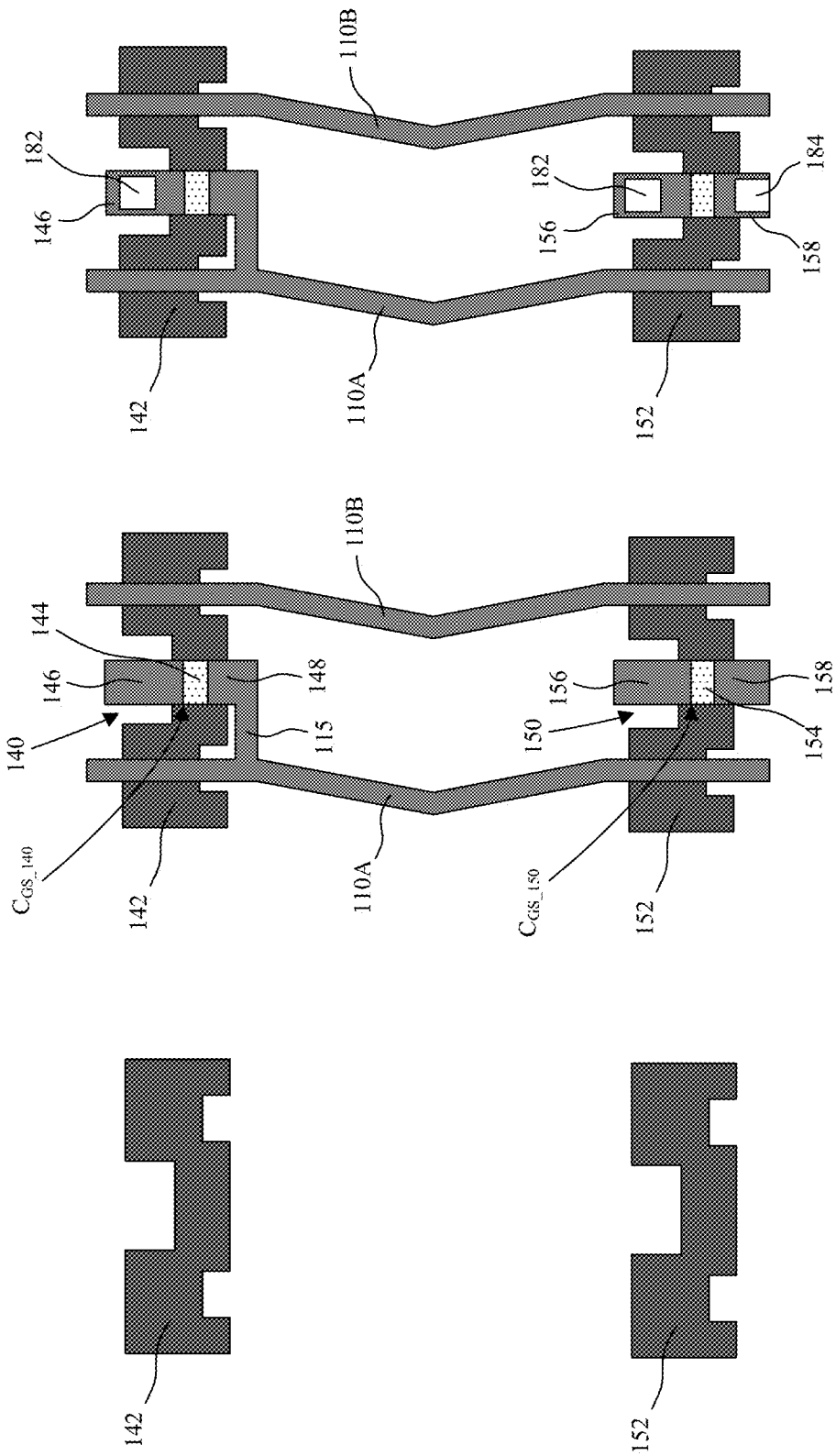

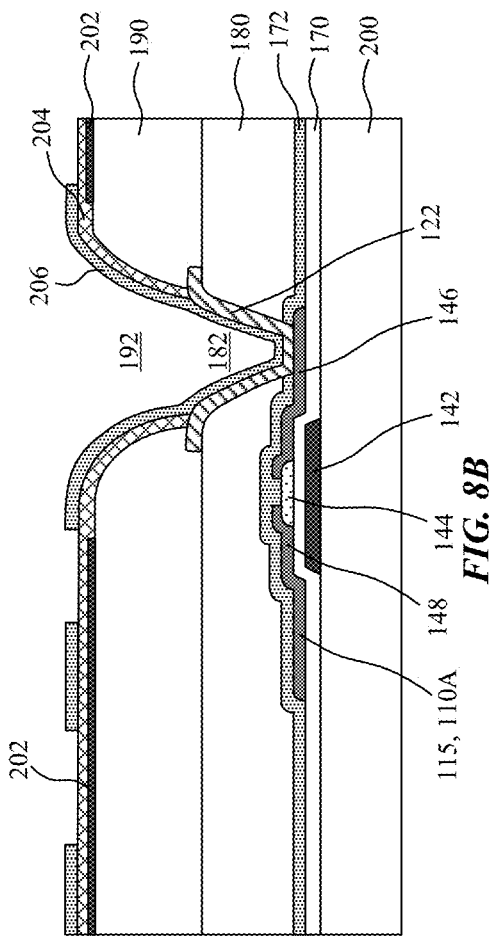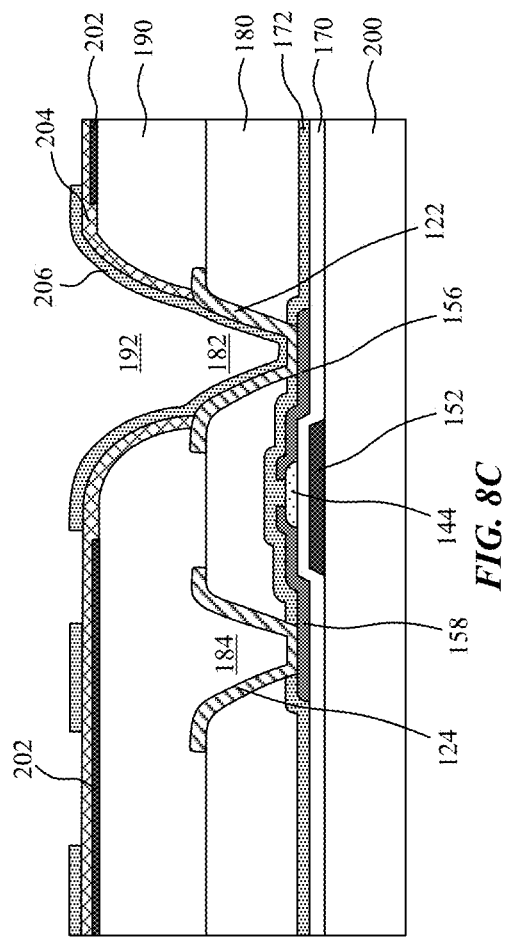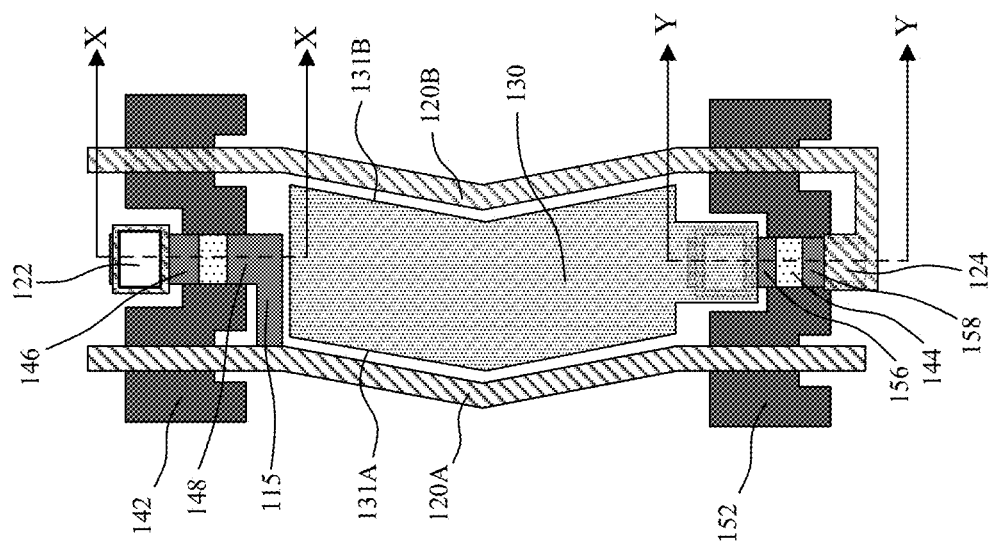

DUAL DATA STRUCTURE FOR HIGH RESOLUTION AND REFRESH RATE

RELATED APPLICATIONS

This application claims the benefit of priority of U.S. Provisional Application No. 62/327,347, filed Apr. 25, 2016, which is incorporated herein by reference.

BACKGROUND

Field

Embodiments described herein relate to an active matrix display, and more specifically to a display backplane and pixel elements including stacked data lines.

Background Information

An active matrix display backplane for liquid crystal displays (LCD) may include pixel electrodes, scanning lines, data lines, and pixel element transistors for selectively driving the pixel electrodes. A driving sequence generally includes sending scan signals to the pixel element transistors, and sending data image signals from the data lines to the pixel element transistors. As display resolution and refresh rates continue to increase, there is a drive to reduce charging time associated with the data image signals in order to mitigate moving image motion blur. One proposed solution has been to shift from silicon based thin film transistors to higher mobility oxide based thin film transistors. Another proposed solution has been to include multiple banks of data lines.

SUMMARY

Embodiments describe display backplanes and pixel element structures. In an embodiment, a display backplane includes a first pair of stacked data lines including a first lower data line and a first upper data line over the first lower data line, and a second pair of stacked data lines including a second lower data line and a second upper data line over the second lower data line. A column of pixel electrodes is located between the first and second pairs of stacked data lines, and a left edge of each pixel electrode is separated from the first lower data line by approximately a same distance as a right edge of the pixel electrode is separated from the second vertical data line.

In an embodiment, a display backplane pixel element includes a first pair of stacked data lines including a first lower data line and a first upper data line over the first lower data line, a second pair of stacked data lines including a second lower data line and a second upper data line over the second lower data line, and a pixel electrode between the first lower data line and the second lower data line. A left edge of the pixel electrode may be separated from the first lower data line by approximately a same distance as a right edge of the pixel electrode is separated from the second lower data line.

In accordance with embodiments, the dual data line stack up structure may reduce charging time for writing a data signal, with no aperture ratio loss of the pixel electrodes in the horizontal direction. All transistors channels may be defined by the same metal layer for uniform gate-source capacitance, $C_{GS}$, across the display backplane. Additionally, parasitic coupling capacitance may be matched between the pixel electrode and the stacked data lines on the left and right sides of the pixel electrodes.

BRIEF DESCRIPTION OF THE DRAWINGS

FIG. 2 is a schematic top view illustration of a pair of bottom gate electrodes adjacent a pixel element in accordance with an embodiment.

FIG. 3 is a schematic top view illustration of a first metal layer including lower data lines and transistor source/drain contacts in accordance with an embodiment FIG. 4 is a schematic top view illustration of a pair of pixel contact openings and a bridge contact opening formed in a planarization layer in accordance with an embodiment.

FIG. 8A is a schematic top view illustration of a pixel element in accordance with an embodiment.

FIG. 8B is a schematic cross-sectional side view illustration taken along line X-X of FIG. 8A illustrating a pixel electrode formed within a pixel contact opening and in contact with a pixel contact in accordance with an embodiment.

FIG. 8C is a schematic cross-sectional side view illustration taken along line Y-Y of FIG. 8A illustrating a pixel electrode formed within a pixel contact opening and in contact with a pixel contact, and a bridge contact formed within a bridge contact opening and on a drain contact in accordance with an embodiment.

DETAILED DESCRIPTION

Figure 1:
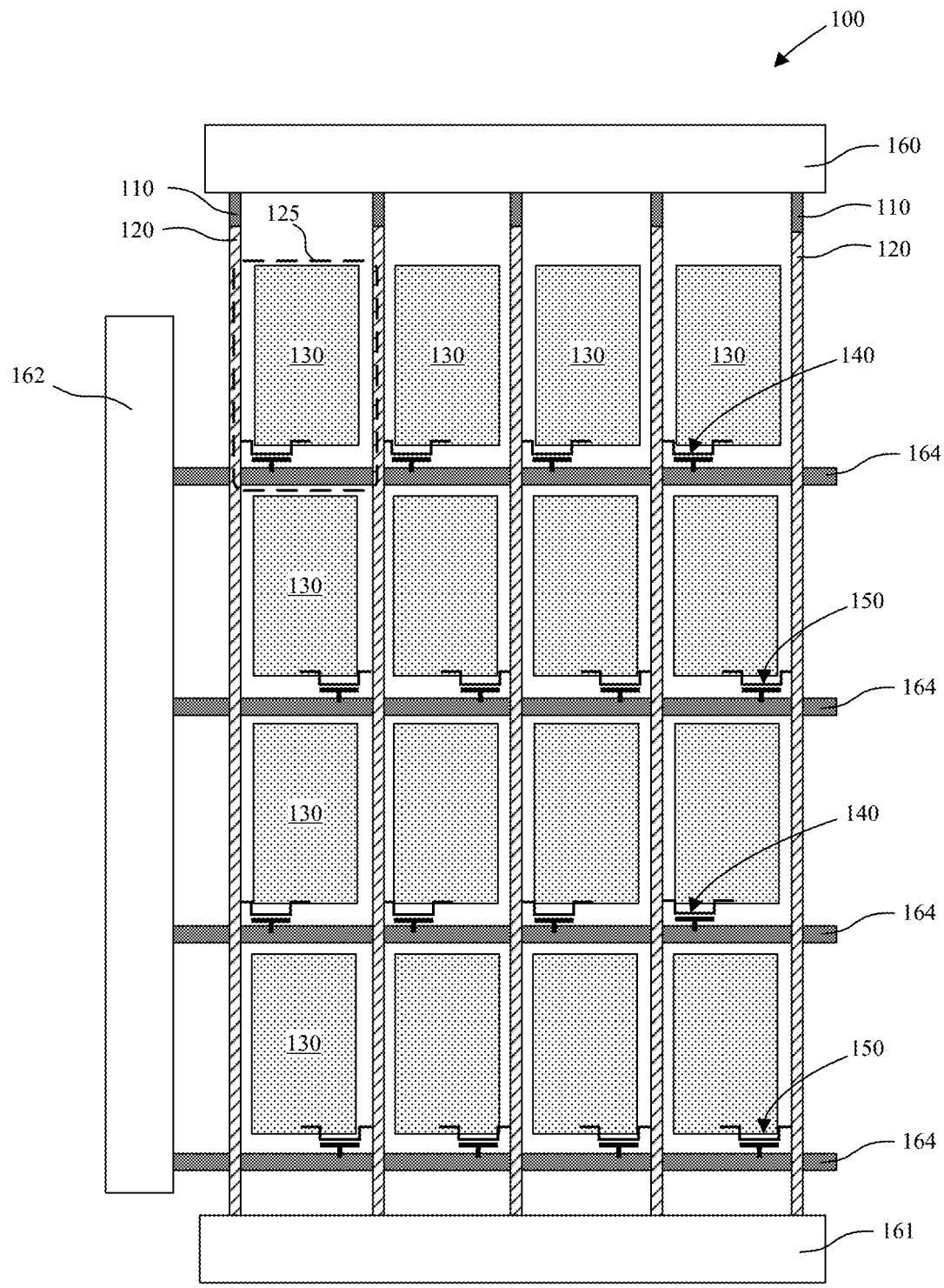
FIG. 1 is a schematic top view illustration of a display backplane in accordance with an embodiment.

Embodiments describe display backplanes and pixel element structures. In an embodiment, a display backplane includes a first pair of stacked data lines including a first lower data line and a first upper data line over the first lower data line, and a second pair of stacked data lines including a second lower data line and a second upper data line over the second lower data line. A column of pixel electrodes is located between the first and second pairs of stacked data lines, and a left edge of each pixel electrode is separated from the first lower data line by approximately a same distance as a right edge of the pixel electrode is separated from the second vertical data line.

In one aspect, embodiments describe a dual data line stack up structure which may reduce charging time from writing a data signal, and allow for implementation into displays with higher refresh rates (e.g. 120 Hz and higher) and higher resolutions. In an embodiment, every odd pixel electrode in a column of pixel electrodes is connected to a first column of transistors and the first lower data line, and every even pixel electrode in the column of pixel electrodes is connected to a second column of transistors and the second upper data line. In this manner, two adjacent pixel electrodes within the column of pixel electrodes are operated by transistors connected to different stacked data lines.

In one aspect, embodiments describe a dual data line stack up structure that may be implemented with no aperture ratio loss of the pixel electrodes in the horizontal direction due to the dual data line stack up.

In another aspect, embodiments describe a pixel element structure including vertical direction transistor channels, extending parallel to the stacked data lines. In addition, all transistor channels may be defined by the same metal layer, which can also form the lower data lines. As a result, gate-source capacitance, $C_{GS}$, of the transistors is consistent across the whole display backplane, and any error caused my misalignment of the patterned metal layer is uniform. Uniform gate-source capacitance may additionally mitigate any kickback voltage difference between even and odd lines.

In yet another aspect, embodiments describe a symmetric pixel element structure in which a left edge of each pixel electrode is separated from the first lower data line by approximately a same distance as a right edge of the pixel electrode is separated from the second lower data line opposite the first lower data line. As a result, first parasitic coupling capacitance between pixel electrode and the first lower data line on the left $(C_{DP\_L})$ matches a second parasitic coupling capacitance between the pixel electrode and the second lower data line on the right $(C_{DP\_R})$ when simultaneously writing data signals through the stacked data lines.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a cross-sectional side view illustration is provided of a display backplane 100 in accordance with an embodiment. As shown, the display backplane may include one or more scan drivers 162 connected to rows of scan lines 164, and one or more data drivers 160, 161 connected to columns of stacked data lines, including lower data lines 110 and upper data lines 120 directly over the lower data lanes 110. In an embodiment, a data driver 160 is connected to lower data lines 110, while data driver 161 is connected to upper data lines 120. As shown, columns of pixel electrodes 130 are located between columns of stacked data lines. In accordance with embodiments, each pixel element 125 may include a single pixel electrode 130. For example, each pixel element 125 may correspond to a subpixel, such as a red-emitting, green-emitting, or blue-emitting subpixel in an RGB pixel arrangement.

As shown in FIG. 1, each pixel element 125 may include a first pair of stacked data lines, a second pair of stacked data lines, and a pixel electrode 130 between the first and second pairs of stacked data lines. In an embodiment, a left edge 131A of each pixel electrode 130 is separated from the first lower data line 110 (e.g. to the left of the pixel electrode 130) by approximately a same distance as a right edge 131B of the pixel electrode 130 is separated from the second lower data line 110 (e.g. to the left of the pixel electrode 130).

In the embodiment illustrated in FIG. 1, the display backplane 100 includes a first column of transistors 140 between the first and second pairs of stacked data lines, and a second column of transistors 150 between the first and second pairs of stacked data lines. As shown, every odd pixel electrode 130 (e.g. every odd row of pixel electrodes 130) is connected to the first column of transistors 140, and every even pixel electrode (e.g. every even row of pixel electrodes 130) is connected to the second column of transistors 150. In turn, a first lower data line 110 (e.g. to the left) may be connected to the first column of transistors 140, while a second lower data line 110 (e.g. to the right) may be connected to the second column of transistors 150. The first column of transistors 140 may be located closer to the first lower data line 110 (e.g. to the left) than to the second lower data line 110 (e.g. to the right), while the second column of transistors 150 may be located closer to the second lower data line (e.g. to the right) than to the first lower data line (e.g. to the left).

In accordance with embodiments, the source and drain contacts for the first and second columns of transistors 140, 150, as well as the lower data lines 110 may be fabricated from the same metal layer. Additionally, the transistors 140, 150 may be vertical transistors, each with an axis between the source and drain contacts running parallel to the stacked data lines. Additionally, the vertical transistors may be bottom gate transistors. In accordance with embodiments, the upper data lines 120 may be fabricated from a second metal layer, which may additionally include bridge contacts to the transistors 150.

Referring now to FIGS. 2-6, schematic top view illustrations are provided for a method of fabricating adjacent pixel elements 125 with stacked data lines in accordance with embodiments. Specifically, FIGS. 2-6 illustrate connecting the transistors 140, 150 of adjacent pixel elements 125 with the stacked data lines including lower data lines 110A (left), 110B (right) and upper data lines 120A (left), 120B (right). FIGS. 7A-7C, and FIGS. 8A-8C illustrate various schematic top view and schematic cross-sectional side view illustrations of completed adjacent pixel elements 125 in accordance with embodiments. In interests of clarity and conciseness, the portions of the description of FIGS. 2-6 may be made with reference to features only illustrated in FIGS. FIGS. 7A-7C, and FIGS. 8A-8C.

Figure 7B:
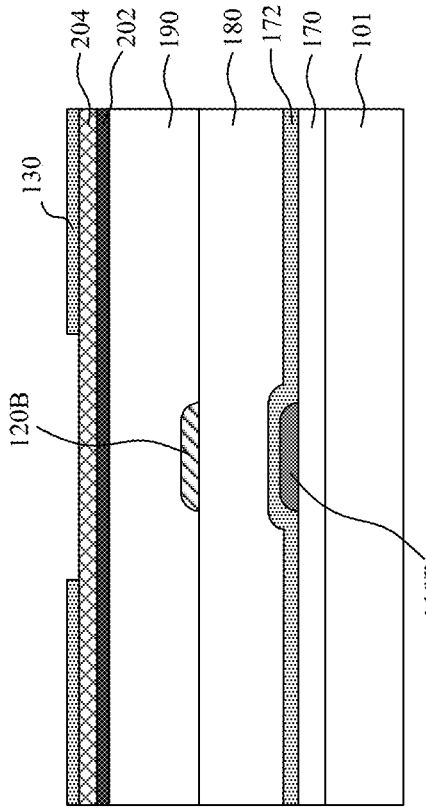
FIG. 7B is a schematic cross-sectional side view illustration taken along line X-X of FIG. 7A illustrating stacked data lines in accordance with an embodiment.
Figure 7C:
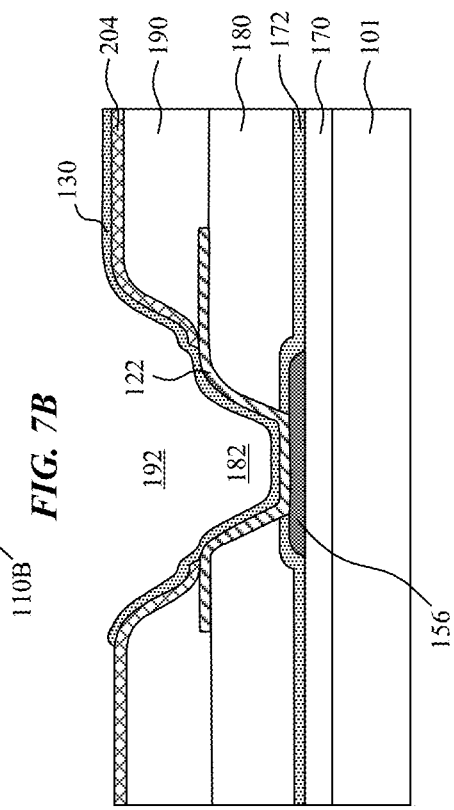
FIG. 7C is a schematic cross-sectional side view illustration taken along line Y-Y of FIG. 7A illustrating a pixel electrode formed within a pixel contact opening and in contact with a pixel contact in accordance with an embodiment.
Figure 7A:
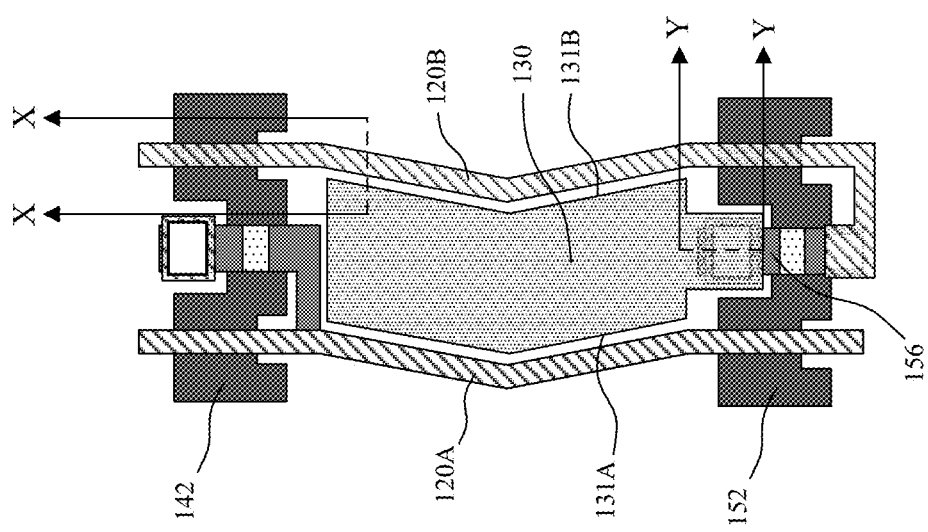
FIG. 7A is a schematic top view illustration of a pixel element in accordance with an embodiment.

FIG. 7C is a schematic cross-sectional side view illustration taken along line Y-Y of FIG. 7A illustrating a pixel electrode 130 formed within a pixel contact opening 182 and in contact with a pixel contact 122 on transistor 150 source contact 156 in accordance with an embodiment. FIG. 8B is a schematic cross-sectional side view illustration taken along line X-X of FIG. 8A illustrating a pixel electrode 130 formed within a pixel contact opening 182 and in contact with a pixel contact 122 on transistor 140 source contact 146 in accordance with an embodiment. FIG. 8C is a schematic cross-sectional side view illustration taken along line Y-Y of FIG. 8A illustrating a pixel electrode 206 formed within a pixel contact opening 182 and in contact with a pixel contact 122 on transistor 150 source contact 156, and a bridge contact 124 formed within a bridge contact opening 184 and on transistor 150 drain contact 158 in accordance with an embodiment.

Referring to FIG. 2, an array of gates 142, 152 are formed on a display substrate 200, such as a glass substrate for example. Gates 142, 152 may be connected with scan lines 164 as illustrated in FIG. 1. Gates 142, 152 and scan lines 164 may be formed of conductive materials including metals such as, aluminum, chromium, molybdenum, etc. An insulating film 170 is then formed over the gates 142, 152 as illustrated in FIGS. 7B-7C and FIGS. 8B-8C. Exemplary insulating films 170 include silicon oxide, silicon nitride, etc. Referring now also to FIG. 3, a semiconductor layer 144 is then patterned over the gates 142, 152. Semiconductor layer 144 may be formed using semiconductor materials such as n-type or p-type amorphous silicon, or a metal oxide material such as indium gallium zinc oxide (IGZO), which may be characterized by a higher electron mobility than amorphous silicon.

Following the formation of semiconductor layer 144, a first metal layer is formed including source contacts 146, 156 and drain contacts 148, 158. The first lower data line 110A, and second lower data line 110B may additionally be formed in the first metal layer, along with tie lines 115 that connect the drain contact 148 to the first lower data line 110A. The first metal layer may be formed of conductive materials including metals such as, aluminum, chromium, molybdenum, titanium, etc. In accordance with embodiments, the transistors 140, 150 may be vertical transistors, each with an axis between the source contacts 146, 156 and drain contacts 148, 158 running parallel to the first lower data line 110A and second lower data line 110B. In addition, all transistor channels within the semiconductor layer(s) 144 may be defined by the same first metal layer. As a result, gate-source capacitance, $C_{GS}$, of the transistors 140, 150 is consistent across the whole display backplane 100, and any error caused my misalignment of the patterned first metal layer is uniform.

Referring briefly to FIGS. 7B-7C and FIGS. 8B-8C, a passivation layer 172 may then be formed over the semiconductor layer 144, and first metal layer including the source contacts 146, 156, drain contacts 148, 158, lower data lines 110A, 110B, and tie lines 115. In an embodiment, passivation layer 172 is formed of an insulating material such as silicon oxide. Following the formation of passivation layer 172, a planarization layer 180 is formed over the underlying structure. In an embodiment, the planarization layer 180 is formed of an inorganic material, including spin-on-glass (SOG), or an organic photoactive material (PAC) such as a resist, acrylic, etc. Now also referring to FIG. 4, pixel contact openings 182 and bridge contact openings 184 are formed through the planarization layer 180 and passivation layer 172 to contact the source contacts 146, 156 and drain contacts 158, respectively.

In accordance with embodiments, the pixel contact openings 182 are formed over each transistor 140, 150, to expose the source contacts 146, 156. Thus, the pixel contact openings 182 are formed in each pixel element 125 in the display backplane 100, in both odd and even lines/rows. In an embodiment, the bridge contact openings 184 are formed over only the transistors 150 to expose the drain contacts 158. In an embodiment, the bridge contact openings 184 are formed only over the transistors in the even lines/rows.

Figure 5:
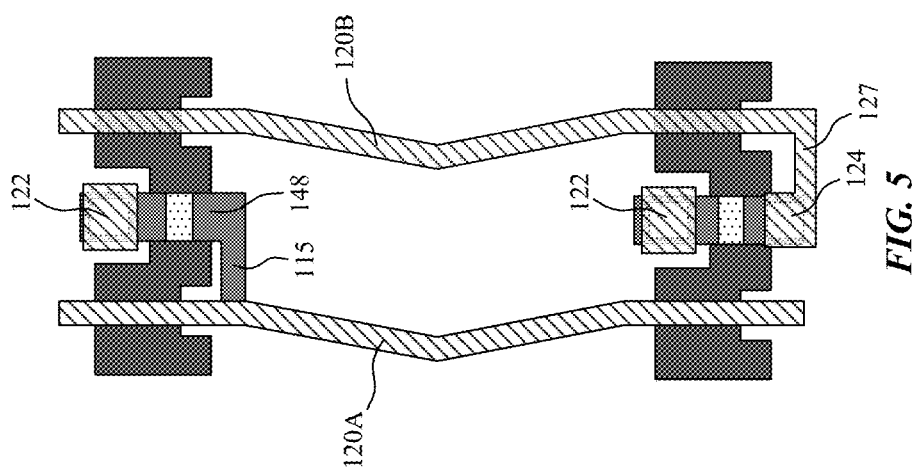
FIG. 5 is a schematic top view illustration of a second metal layer including upper data lines formed over the lower data lines, pixel contacts, and a bridge contact in accordance with an embodiment.

Referring now to FIG. 5 along with FIGS. 7B-7C and FIGS. 8B-8C, a second metal layer is formed over the patterned planarization layer 180 to form the upper data lines 120, including upper data line 120A and upper data line 120B. As shown, the upper data lines 120 may be formed directly over the lower data lines 110. The second metal layer may additional include bridge contacts 124 formed within the bridge contact openings 184 and on the drain contacts 158, as well as bridge tie lines 127. The second metal layer may additionally include pixel contacts 122 formed within the pixel contact openings 182 and on the source contacts 146, 156. The second metal layer may be formed of conductive materials including metals such as, aluminum, chromium, molybdenum, titanium, etc.

A second planarization layer 190 may then be formed over the underlying structure. In an embodiment, the planarization layer 190 is formed of an organic photoactive material (PAC) such as a resist, acrylic, etc. In an embodiment, planarization layer 180 is formed of SOG material, while the second planarization layer 190 is formed of PAC material. In an embodiment, the SOG material is characterized by a lower dielectric contact than the PAC material, which may reduce data loading. Pixel openings 192 may then be formed through the planarization layer 190 over the pixel contact openings 182 to expose the pixel contacts 122.

Figure 6:
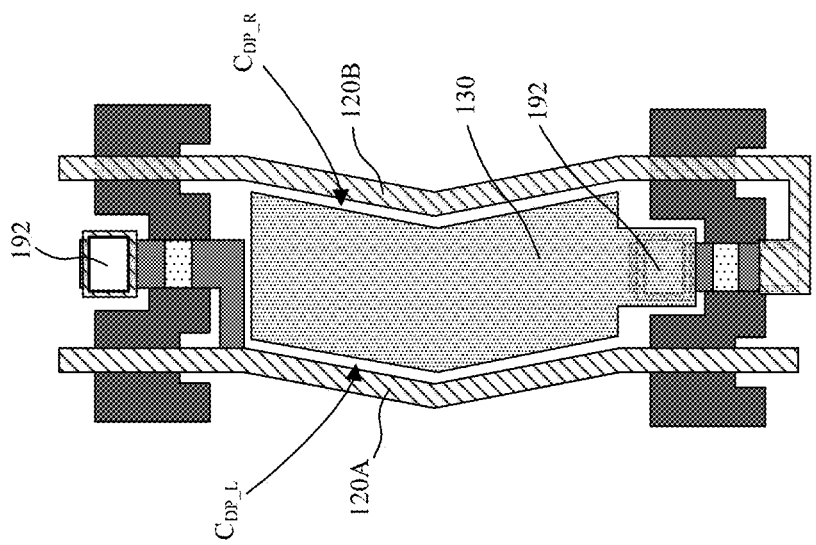
FIG. 6 is a schematic top view illustration of a pixel electrode formed over a pixel contact within a pixel element in accordance with an embodiment.

Referring to FIG. 6 along with FIGS. 7B-7C and FIGS. 8B-8C, following the formation of pixel openings 192 a common electrode layer 202 may be formed in each pixel element 25, followed by the formation of liquid crystal layers 204 within the pixel elements 25, and the formation of pixel electrodes 206. For example, pixel electrodes 206 may be formed of a suitable transparent material, including conductive oxides such as indium-tin-oxide (ITO) and conductive polymers. While not specifically illustrated in FIG. 6, a pixel electrode 206 is formed within each pixel openings 192, pixel contact openings 182, and in contact with each pixel contact 122.

In an embodiment, a display backplane pixel element 125 includes a first pair of stacked data lines including a first lower data line 110A and a first upper data line 120A over the first lower data line 110A, a second pair of stacked data lines including a second lower data line 110B and a second upper data line 120B over the second lower data line 110B, and a pixel electrode 130 between the first lower data line 110A and the second lower data line 110B. A left edge 131A of the pixel electrode 130 may be separated from the first lower data line 110A by approximately a same distance as a right edge 131B of the pixel electrode 130 is separated from the second lower data line 110B.

A bottom gate transistor 150 is located between the first and second lower data lines 110A, 110B. and a planarization layer 180 is over the bottom gate transistor 150 and the first and second lower data lines 110A, 110B. A bridge contact opening 184 may be formed in the planarization layer 180 over a drain contact 158 of the bottom gate transistor 150, and a bridge contact 124 may be formed within the bridge contact opening 184. In accordance with embodiments, the second upper data line 120B may be physically connected to the bridge contact 124. For example, the second upper data line 120B and the bridge contact 124 may be formed of the same metal layer. In an embodiment, a pixel contact opening 182 is formed in the planarization layer 180 over a source contact 156 of the bottom gate transistor 150, and a pixel contact 122 is on the source contact 156 and within the pixel contact opening 182.

In an embodiment, the source contact 156 and drain contact 158 of the bottom gate transistor 150, the first lower data line 110A, and the second lower data line 120B are all formed in the same metal layer. The bottom gate transistor may be a vertical transistor with an axis extending between the source and drain contacts 156, 158 and running parallel to the first and second pairs of stacked data lines. In an embodiment, the first upper data line 120A, the second upper date line 120B, and a bridge contact 124 that is one the drain contact 158 are formed of the same metal layer, with the bridge contact being physically connected to the second upper data line 120B. In an embodiment, the pixel contact 122 is formed in the same metal layer as the first upper data line 120A, the second upper date line 120B, and the bridge contact 124.

In an embodiment, a method of operating an active matrix display includes simultaneously writing a first data signal to a first transistor 140 from a first lower data line 110A, and a second data signal to a second transistor 150 from a second upper data line 120B. The active matrix display may include a backplane 100 including a first pair of stacked data lines including the first lower data line 110A and a first upper data line 120A over the first lower data line 110A, and a second pair of stacked data lines including a second lower data line 110B and the second upper data line 120B over the second lower data line 110B. The first transistor 140 and a second transistor 150 are between the first and second pairs of stacked data lines, and a first pixel electrode 130 and a second pixel electrode 130 are in a column of pixel electrodes 130 between the first and second pairs of stacked data lines. In accordance with embodiments, a first parasitic coupling capacitance between the first and second pixel electrodes and the first lower data line, $C_{DP\_L}$, matches a second parasitic coupling capacitance between the first and second pixel electrodes and the second lower data line, $C_{DP\_R}$, when simultaneously writing the first and second data signals. In accordance with embodiments, the write time for the first data signal and the second data signal is less than 6.0 microseconds, less than 2.0 microseconds, or even less than 1.0 microsecond. In accordance with embodiments, a first gate-source capacitance, $C_{GS}$, of the first transistor 140 is equal to a second gate-source capacitance, $C_{GS}$, of the second transistor 150.

Figure 9:
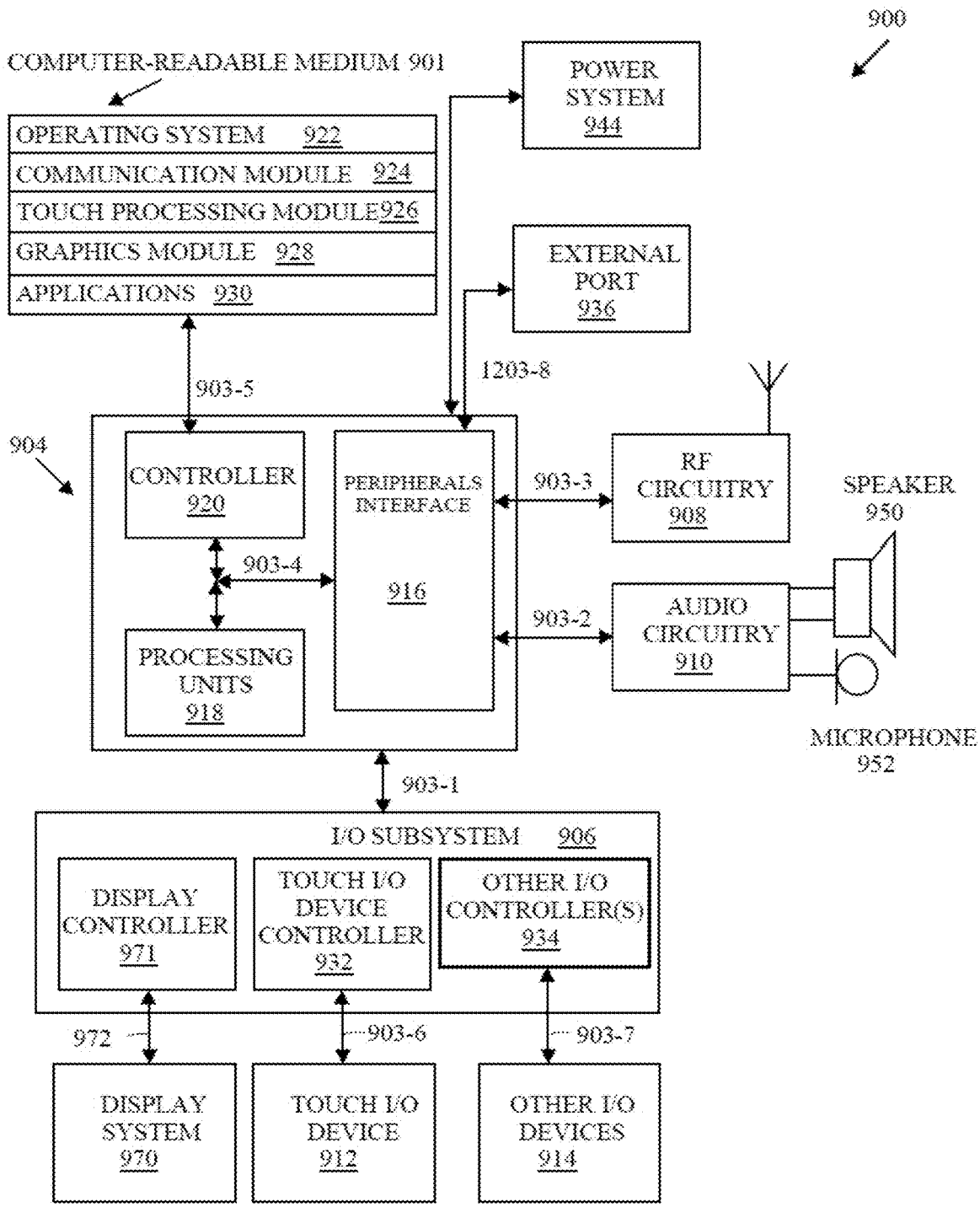
FIG. 9 is a block diagram of one embodiment of a system that generally includes one or more computer-readable mediums, processing system, Input/Output (I/O) subsystem, radio frequency (RF) circuitry and audio circuitry.
Figure 10:
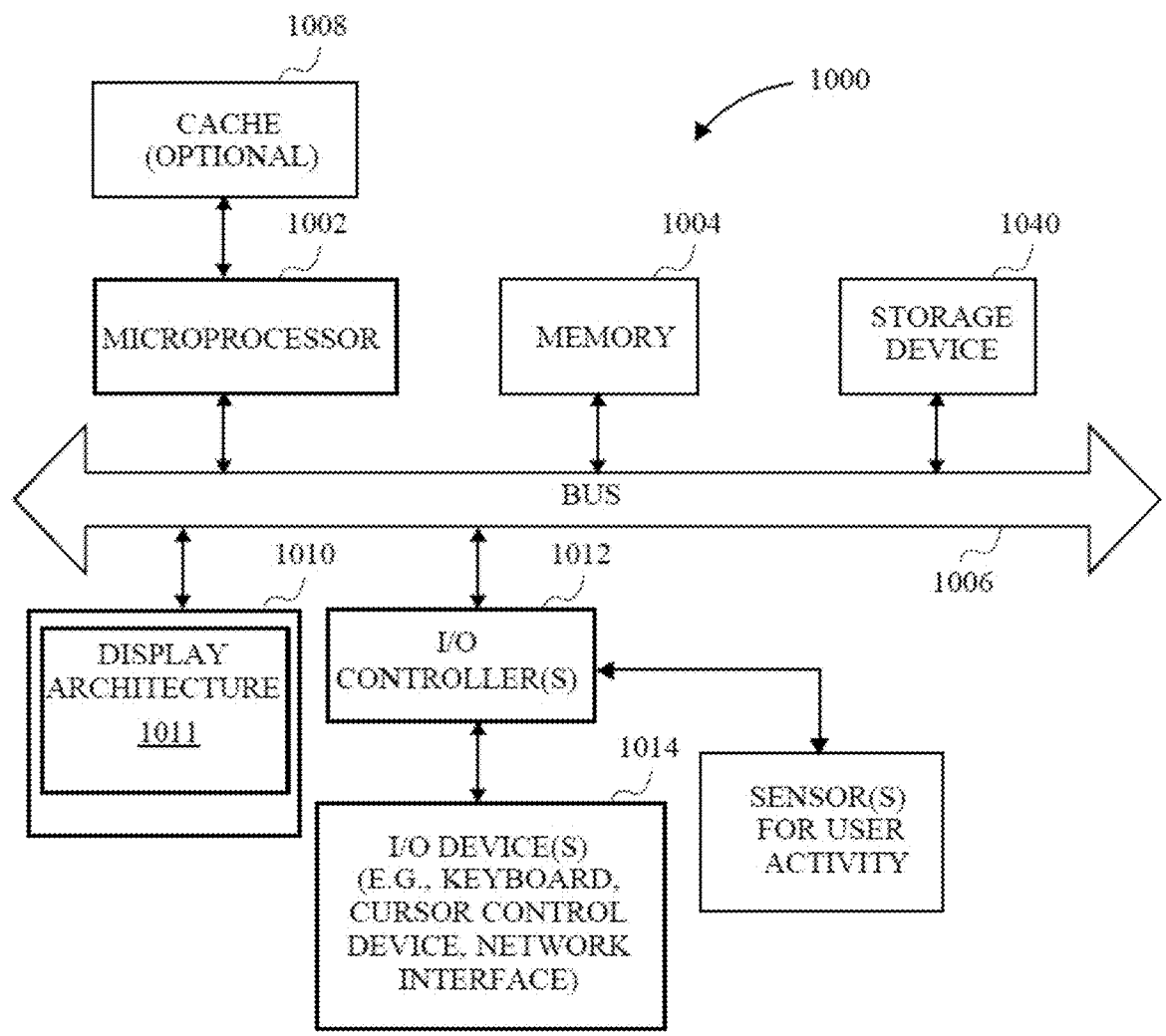
FIG. 10 shows another example of a device according to an embodiment.

In some embodiments, the methods, systems, backplanes and pixel elements of the present disclosure can be implemented in various devices including electronic devices, consumer devices, data processing devices, desktop computers, portable computers, wireless devices, cellular devices, tablet devices, display screens, televisions, handheld devices, multi touch devices, multi touch data processing devices, wearable devices, any combination of these devices, or other like devices. FIG. 9 and FIG. 10 illustrate examples of a few of these devices.

Attention is now directed towards embodiments of a system architecture that may be embodied within any portable or non-portable device including but not limited to a communication device (e.g., mobile phone, smart phone, smart watch, wearable device), a multi-media device (e.g., MP3 player, TV, radio), a portable or handheld computer (e.g., tablet, netbook, laptop), a desktop computer, an All-In-One desktop, a peripheral device, a television, or any other system or device adaptable to the inclusion of system architecture, including combinations of two or more of these types of devices.

FIG. 9 is a block diagram of one embodiment of the system 900 that generally includes one or more computer-readable mediums 901, processing system 904, Input/Output (I/O) subsystem 906, radio frequency (RF) circuitry 908 and audio circuitry 910. These components may be coupled by one or more communication buses or signal lines 903 (e.g., 903-1, 903-2, 903-3, 903-4, 903-5, 903-6, 903-7, 908-8).

It should be apparent that the architecture shown in FIG. 9 is only one example architecture of system 900, and that system 900 could have more or fewer components than shown, or a different configuration of components. The various components shown in FIG. 9 can be implemented in hardware, software, firmware or any combination thereof, including one or more signal processing and/or application specific integrated circuits.

RF circuitry 908 is used to send and receive information over a wireless link or network to one or more other devices and includes well-known circuitry for performing this function. RF circuitry 908 and audio circuitry 910 are coupled to processing system 904 via peripherals interface 916. Interface 916 includes various known components for establishing and maintaining communication between peripherals and processing system 904. Audio circuitry 910 is coupled to audio speaker 950 and microphone 952 and includes known circuitry for processing voice signals received from interface 916 to enable a user to communicate in real-time with other users. In some embodiments, audio circuitry 910 includes a headphone jack (not shown).

Peripherals interface 916 couples the input and output peripherals of the system to processing units 918 and computer-readable medium 901. One or more processing units 918 communicate with one or more computer-readable mediums 901 via controller 920. Computer-readable medium 901 can be any device or medium (e.g., storage device, storage medium) that can store code and/or data for use by one or more processing units 918. Medium 901 can include a memory hierarchy, including but not limited to cache, main memory and secondary memory. The memory hierarchy can be implemented using any combination of RAM (e.g., SRAM, DRAM, DDRAM), ROM, FLASH, magnetic and/or optical storage devices, such as disk drives, magnetic tape, CDs (compact disks) and DVDs (digital video discs). Medium 901 may also include a transmission medium for carrying information-bearing signals indicative of computer instructions or data (with or without a carrier wave upon which the signals are modulated). For example, the transmission medium may include a communications network, including but not limited to the Internet (also referred to as the World Wide Web), intranet(s), Local Area Networks (LANs), Wide Local Area Networks (WLANs), Storage Area Networks (SANs), Metropolitan Area Networks (MAN) and the like.

One or more processing units 918 run various software components stored in medium 901 to perform various functions for system 900. In some embodiments, the software components include operating system 922, communication module (or set of instructions) 924, touch processing module (or set of instructions) 926, graphics module (or set of instructions) 928, and one or more applications (or set of instructions) 930. In some embodiments, medium 901 may store a subset of the modules and data structures identified above. Furthermore, medium 901 may store additional modules and data structures not described above.

Operating system 922 includes various procedures, sets of instructions, software components and/or drivers for controlling and managing general system tasks (e.g., memory management, storage device control, power management, etc.) and facilitates communication between various hardware and software components.

Communication module 924 facilitates communication with other devices over one or more external ports 936 or via RF circuitry 908 and includes various software components for handling data received from RF circuitry 908 and/or external port 936.

Graphics module 928 includes various known software components for rendering, animating and displaying graphical objects on a display surface. In embodiments in which touch I/O device 912 is a touch sensitive display (e.g., touch screen), graphics module 928 includes components for rendering, displaying, and animating objects on the touch sensitive display. The display backplane 100 and pixel elements 125 of the present design may be implemented with display system 970 which may be coupled with a display controller 1271 via communication link 972.

One or more applications 930 can include any applications installed on system 900, including without limitation, a game center application, a browser, address book, contact list, email, instant messaging, word processing, keyboard emulation, widgets, JAVA-enabled applications, encryption, digital rights management, voice recognition, voice replication, location determination capability (such as that provided by the global positioning system (GPS)), a music player, etc.

Touch processing module 926 includes various software components for performing various tasks associated with touch I/O device 912 including but not limited to receiving and processing touch input received from I/O device 912 via touch I/O device controller 932.

FIG. 10 shows another example of a device according to an embodiment of the disclosure. This device 1000 may include one or more processors, such as microprocessor(s) 1002, and a memory 1004, which are coupled to each other through a bus 1006. The device 1000 may optionally include a cache 1008 which is coupled to the microprocessor(s) 1002. The device may optionally include a storage device 1040 which may be, for example, any type of solid-state or magnetic memory device. Storage device 1040 may be or include a machine-readable medium.

This device may also include a display controller and display device 1010 which is coupled to the other components through the bus 1006. The display backplane 100 and pixel elements 125 of the present design may be implemented in the display device 1010 and display controller.

One or more input/output controllers 1012 are also coupled to the bus 1006 to provide an interface for input/output devices 1014 and to provide an interface for one or more sensors 1016 which are for sensing user activity. The bus 1006 may include one or more buses connected to each other through various bridges, controllers, and/or adapters as is well known in the art. The input/output devices 1014 may include a keypad or keyboard or a cursor control device such as a touch input panel. Furthermore, the input/output devices 1014 may include a network interface which is either for a wired network or a wireless network (e.g. an RF transceiver). The sensors 1016 may be any one of the sensors described herein including, for example, a proximity sensor or an ambient light sensor. In at least certain implementations of the device 1000, the microprocessor(s) 1002 may receive data from one or more sensors 1016 and may perform the analysis of that data in the manner described herein.

In certain embodiments of the present disclosure, the device/system 1000 or 900 or combinations of device/system 1000/900 can be used to drive display data to a display device and implement at least some of the methods discussed in the present disclosure.

In utilizing the various aspects of the embodiments, it would become apparent to one skilled in the art that combinations or variations of the above embodiments are possible for forming display backplane with stacked data lines. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display backplane comprising:
    a first pair of stacked data lines including a first lower data line and a first upper data line over the first lower data line, wherein the first lower data line is electrically separate from the first upper data line;
    a second pair of stacked data lines including a second lower data line and a second upper data line over the second lower data line, wherein the second lower data line is electrically separate from the second upper data line;
    a column of pixel electrodes between the first and second pairs of stacked data lines;
    wherein a left edge of each pixel electrode is separated from the first lower data line by approximately a same distance as a right edge of the pixel electrode is separated from the second lower data line.

2. The display backplane of claim 1, further comprising a first column of transistors between the first and second pairs of stacked data lines, and a second column of transistors between the first and second pairs of stacked data lines.

3. The display backplane of claim 2, wherein every odd pixel electrode is connected to the first column of transistors, and every even pixel electrode is connected to the second column of transistors.

4. The display backplane of claim 3, wherein the first lower data line is connected to the first column of transistors, and the second upper data line is connected to the second column of transistors.

5. The display backplane of claim 2, wherein the first column of transistors is located closer to the first lower data line than the second lower data line, and the second column of transistors is located closer to the second lower data line than the first lower data line.

6. The display backplane of claim 2, further comprising a first metal layer including:
    first source and drain contacts for the first column of transistors;
    second source and drain contacts for the second column of transistors;
    the first lower data line; and
    the second lower data line.

7. The display backplane of claim 6, wherein the transistors in the first and second columns of transistors are vertical transistors, with an axis extending between the source and drain contacts running parallel to the first and second pairs of stacked data lines.

8. The display backplane of claim 7, wherein the vertical transistors are bottom gate transistors.

9. The display backplane of claim 7, further comprising a second metal layer including:
    the first upper data line;
    the second upper data line; and bridge contacts on the drain contacts for the second column of transistors, wherein the bridge contacts are physically connected to the second upper data line.

10. A display backplane pixel element comprising:
a first pair of stacked data lines including a first lower data line and a first upper data line over the first lower data line, wherein the first lower data line is electrically separate from the first upper data line;
a second pair of stacked data lines including a second lower data line and a second upper data line over the second lower data line, wherein the second lower data line is electrically separate from the second upper data line;
a pixel electrode between the first lower data line and the second lower data line;
wherein a left edge of the pixel electrode is separated from the first lower data line by approximately a same distance as a right edge of the pixel electrode is separated from the second lower data line.

11. The display backplane pixel element of claim 10, further comprising:
a bottom gate transistor between the first and second lower data lines; and
a planarization layer over the bottom gate transistor and the first and second lower data lines.

12. The display backplane pixel element of claim 11, further comprising:
a bridge contact opening in the planarization layer over a drain contact of the bottom gate transistor; and
a bridge contact on the drain contact and within the bridge contact opening.

13. The display backplane pixel element of claim 12, wherein the second upper data line is physically connected to the bridge contact.

14. The display backplane pixel element of claim 13, further comprising:
a pixel contact opening in the planarization layer over a source contact of the bottom gate transistor; and
a pixel contact on the source contact and within the pixel contact opening.

15. The display backplane pixel element of claim 11, further comprising a first metal layer including:
a source contact and a drain contact for the bottom gate transistor;
the first lower data line; and
the second lower data line.

16. The display backplane pixel element of claim 15, wherein the bottom gate transistor is a vertical transistor, with an axis extending between the source and drain contacts running parallel to the first and second pairs of stacked data lines.

17. The display backplane pixel element of claim 16, further comprising a second metal layer including:
the first upper data line;
the second upper data line; and
a bridge contact on the drain contact for the vertical transistor, wherein the bridge contact is physically connected to the second upper data line.

* * * * *